United States Patent [19]
Schäfer

[11] Patent Number: 5,963,044
[45] Date of Patent: Oct. 5, 1999

[54] METHOD FOR ACQUIRING MEASURED VALUES BY COMPARISON WITH A STEPPED RAMP VOLTAGE

[75] Inventor: Gerhard Schäfer, Weinsberg, Germany

[73] Assignee: Temic Telefunken microelectronic GmbH, Heilbronn, Germany

[21] Appl. No.: 08/916,632

[22] Filed: Aug. 22, 1997

[30]   Foreign Application Priority Data

Aug. 23, 1996 [DE]  Germany .......................... 196 34 049

[51] Int. Cl.⁶ .......................... G01R 27/08; H03M 1/56; B60R 21/30
[52] U.S. Cl. .......................... 324/713; 324/606; 341/169; 280/735
[58] Field of Search .......................... 324/378, 379, 324/383, 602, 605, 606, 713; 307/10.1; 340/436, 437, 438; 280/728.1, 734, 735; 341/169

[56]   References Cited

U.S. PATENT DOCUMENTS

| 3,634,851 | 1/1972 | Klein | 341/169 |
| 4,127,810 | 11/1978 | Purland | 341/169 |

FOREIGN PATENT DOCUMENTS

| 1212140 | 1/1964 | Germany . |
| 3922229 | 1/1991 | Germany . |
| 4244264 | 7/1993 | Germany . |
| 1397288 | 6/1975 | United Kingdom . |
| WO 9209461 | 6/1992 | WIPO . |

OTHER PUBLICATIONS

H. Bernstein: "Elektronische Messtechnik". In: Der Elektromeister—deutsches Elektrohandwerk, 22/78, pp. 1683–1686.

Primary Examiner—Diep N. Do
Attorney, Agent, or Firm—Venable; George H. Spencer; Norman N. Kunitz

[57]   ABSTRACT

A method for acquiring measured values in electronic analog circuits having at least one measurement point, in particular safety-relevant circuits for passenger protection systems in motor vehicles. The electrical potentials generated at the measurement points are each compared as measured quantities with a ramp voltage that rises in steps, where the number of steps required to reach the voltage value of the measured quantity at the respective measurement point is provided as a unit of measurement that is proportional to the measured quantity. This allows the comparison of all measured quantities with the ramp voltage to be performed simultaneously, the ramp voltage being selected to cover the entire range of measurement.

6 Claims, 5 Drawing Sheets

METHOD FOR ACQUIRING MEASURED VALUES BY COMPARISON WITH A STEPPED RAMP VOLTAGE

BACKGROUND OF THE INVENTION

The invention relates to a method for acquiring measured values in electronic analog circuits having at least one measurement point, in particular safety-relevant circuits for passenger protection systems in motor vehicles, and a circuit arrangement for performing the method according to the invention.

In the case of passenger protection systems in motor vehicles comprising human protection devices such as airbags, belt tighteners and suchlike, a very high degree of system reliability is required. In particular, in the case of safety-critical electronic circuits, it is required that these are always ready to function and that if a fault occurs it will be displayed immediately because the user of a vehicle can immediately arrange for the passenger protection system to be inspected and repaired.

In airbag or belt-tightener systems, therefore, electrical and/or electronic components of the system are tested for proper functioning in the course of a self-diagnostics routine performed by the system electronics. This necessitates the implementation of additional circuit units in the electronic components of the system in order to generate test signals and to acquire measured values.

Thus, after the onboard power supply of the motor vehicle has been switched on, a comprehensive self-test is performed and also cyclic self-tests while the motor vehicle is in operation, where the comprehensive self-test that is performed when switching on the power supply serves as a basis for the subsequent cyclic self-tests.

The self-test of analog switching functions of the electronic components of a passenger protection system is particularly critical here on account of the wide variety of faults. Apart from the switching function as such, parametric errors or range tolerances must also be recorded. If such faults are to be registered, it is necessary to be able to stimulate the electronic components of such passenger protection systems accordingly and also to have the means available of performing analog measurements.

In existing safety systems, relatively elaborate A/D converters are used for this purpose to which the relevant measured quantities are offered via analog multiplexers. This measured quantity is then converted into a digital value and evaluated in a digital arithmetic unit (microprocessor).

As a rule, this digital arithmetic unit is normally also responsible for controlling the stimulation of the electronic components in order to generate appropriate measured quantities and for controlling the multiplexers.

Apart from the expense of applying analog multiplexers, considerable circuitry must usually be implemented for matching the signal to the input range of the A/D converter. Influencing factors such as various operating temperatures or crosstalk from other modules, especially when signals are transmitted beyond the individual components, must also be taken into consideration.

SUMMARY OF THE INVENTION

The object of the invention is therefore to provide a simple method for acquiring measured values at electronic analog circuits having at least one measurement point, and in particular safety-critical circuits for passenger protection systems in motor vehicles, permitting low-cost realization and at the same time allowing diagnostic functions, in particular self-tests, to be performed reliably.

Furthermore, a circuit arrangement for performing the method according to this invention is provided.

According to the invention, the electrical voltages generated at the measurement points are compared as measured quantities with a ramp voltage that rises in steps, where the number of steps required to reach the voltage value of the measured quantity at the relevant measurement point serves as the unit of measurement, i.e. it represents a direct means of measurement for the measured value of the measured quantity.

According to the invention, the ramp voltage is thus compared with all measured quantities and at the same time the number of steps needed to reach the measured value of the relevant measured quantity with the ramp voltage is established. The voltage range of this ramp voltage is selected here such that it covers the entire measuring range required. This method according to the invention is very simple and can be realized with low-cost and standardized components, for instance by using the simplest of comparators and ramp generators.

In a particularly advantageous type of embodiment of the method according to the invention, the ramp voltage is compared with a reference voltage in order to calibrate the unit of measurement. This enables all measuring devices to be calibrated at once with just one single reference signal so that all measuring errors are recorded and, in particular, no temperature compensation is needed. The measuring error is thus established before each measurement and can therefore be allowed for in the evaluation of the measured value.

A measurement consists preferably of one measuring cycle with several steps, commencing with the stimulation of the circuit in order to generate a measured value at a selected measurement point, followed by generation of the ramp voltage by a specific voltage step starting at value "0", and then comparison of this ramp voltage with the measured quantity. If the ramp voltage is less than the measured quantity, the ramp voltage is incremented by a further voltage step and at the same time the number of voltage steps is determined in order to subsequently repeat the comparison process. If the ramp voltage is greater than the measured quantity, however, the measuring operation is ended and the number of voltage steps is evaluated.

For calibration of the unit of measurement, the same steps are performed as for the measuring cycle described above, except that, instead of stimulating the circuit to generate a measured quantity, the reference voltage is generated.

Finally, in a last type of embodiment of the method according to the invention, the evaluation of the number of voltage steps determined with a measuring cycle or with the calibration process can be performed by software using a microprocessor.

A circuit arrangement for performing the method according to the invention requires a clocked ramp generator in order to generate the ramp voltage and for each measured quantity a comparator that performs the comparison of the measured quantity with the ramp voltage. Furthermore, in order to calibrate the unit of measurement, only one single reference voltage source is needed and a comparator that compares the reference voltage generated by the reference voltage source with the ramp voltage.

Finally, in order to establish the number of voltage steps, a pulse counter can be provided which is driven together with the ramp generator from a microprocessor. Alternatively, the number of voltage steps can also be stored in a microprocessor.

BRIEF DESCRIPTION OF THE DRAWINGS

The method according to the invention will be described and explained below on the basis of embodiment examples relating to the drawings wherein.

DETAILED DESCRIPTION OF THE PREFERRED EMBODIMENT

Figure 1:
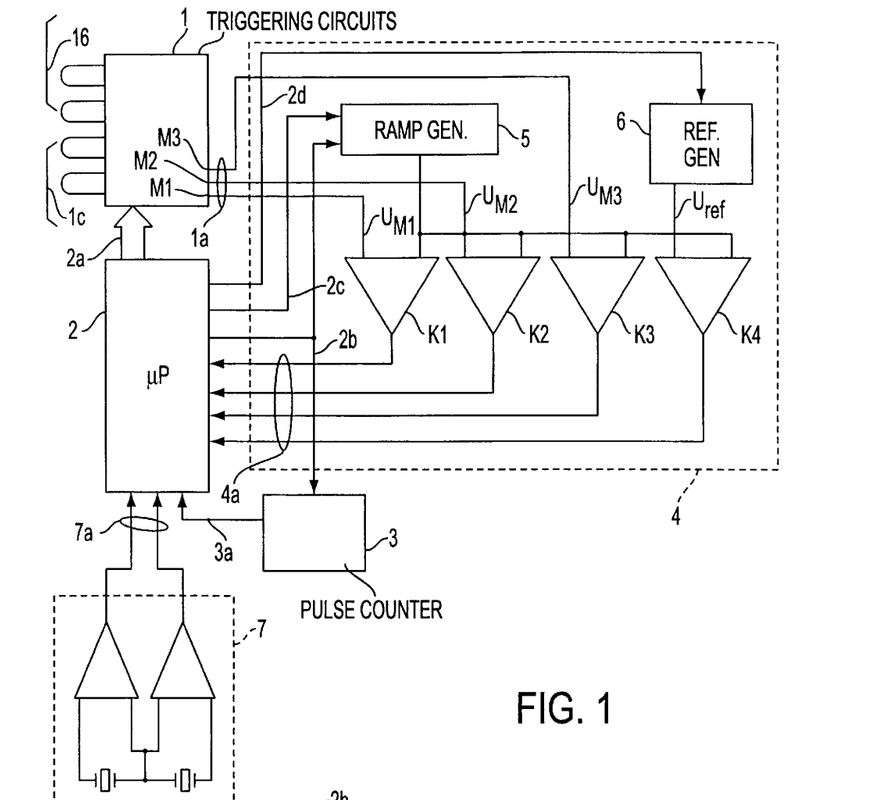
FIG. 1 is a block circuit diagram for performing the method according to the invention.

The block diagram shown in FIG. 1 for a passenger protection system with airbags and belt tighteners includes a microprocessor 2 as central system control unit, a triggering circuit 1 that is driven by the microprocessor 2 through a cable 2a and which drives the relevant triggering devices such as the ignition pills for the airbags 1b and the belt tightener 1c through associated output stages that have the necessary power transistors to control the triggering current flowing through the ignition pills. Triggering of these protection devices 1b and 1c is effected by means of the microprocessor 2 in accordance with the acceleration signals generated by a sensor unit 7 and supplied to this microprocessor 2 through lines 7a for evaluation. This sensor unit 7 contains two acceleration sensors whose acceleration signals are amplified before being sent on to the microprocessor 2.

Triggering of certain diagnostics functions is also initiated in the triggering circuit 1 through microprocessor 2. Measurement points M1, M2 and M3, at which measuring-circuit voltages are generated and fed through a line 1a of a measuring circuit 4 in order to perform the method according to the invention, are provided on this triggering circuit 1 for this purpose.

For this purpose, this measuring circuit 4 includes a ramp generator 5 which is connected to one input of each of four comparators K1, K2, K3 and K4. This ramp generator 5 generates a stair-step ramp voltage $U_R$ as shown in the voltage/time graph of FIG. 4. Also, the measuring circuit 4 includes a reference voltage source 6 in order to generate a reference voltage $U_{ref}$ of, for example, 1.205 V which is applied to the second input of the comparator K4. The measured quantities $U_{M1}$, $U_{M2}$ and $U_{M3}$ generated at the measurement points M1, M2 and M3 are supplied to the second inputs of the comparators K1, K2 and K3 respectively.

The outputs of the comparators K1 to K4 lead to one input each of the microprocessor 2 and are designated by the reference numeral 4a. This microprocessor 2 resets the ramp generator 5 via a line 2c. A further line 2b is provided to cyclically drive the ramp generator 5 in order to generate the stair-step ramp voltage. At the same time, the clock pulses provided on line 2b are fed to a pulse counter 3 the count of which is sent to the microprocessor 2 through a line 3a. Alternatively, the number of clock pulses can be stored in the microprocessor 2 so that the pulse counter 3 can be omitted. Finally, the microprocessor 2 generates through a line 2d a control signal for the reference voltage source 6.

The rising stair-step ramp voltage $U_R$ generated by the ramp generator 5 is compared by means of the comparators K1 to K4 with the measured quantity $U_{M1}$, $U_{M2}$ and $U_{M3}$, i.e., a voltage signal, provided at the respective measurement points M1, M2 and M3. If the ramp voltage $U_R$ becomes greater than the measured quantity $U_{M1}$, $U_{M2}$ or $U_{M3}$ the output of the relevant comparator K1, K2 or K3 switches its output over to another voltage level which causes the microprocessor 2 to evaluate the number of voltage steps required to switch over the respective comparator. If the ramp voltage passes through the entire measuring range of the measured quantities $U_{M1}$, $U_{M2}$ and $U_{M3}$ then, in the course of the rise of the ramp voltage $U_R$ all comparators K1 to K3 switch over so that when the last comparator switches over, the measurement can be ended by microprocessor 2. since the outputs of the comparators K1 to K3 are connected in parallel to the microprocessor 2, evaluation of the determinant number of voltage steps for each measured quantity can be carried out in parallel. This is only possible, however, if the number of inputs on the microprocessor 2 is sufficient.

Figure 2:
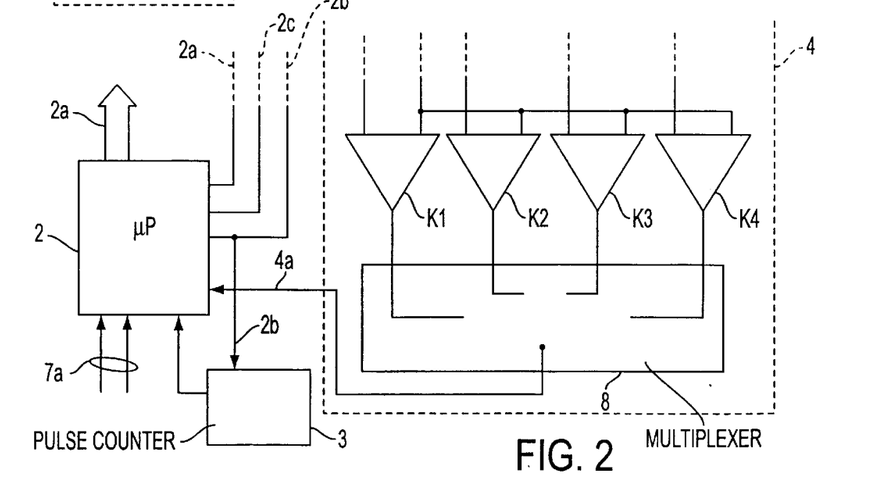
FIG. 2 is a modified block circuit diagram in accordance with the embodiment example shown in FIG. 1.

With a limited number of inputs on the microprocessor 2, the outputs of the comparators K1 to K3 can be supplied to a multiplexer 8 which supplies the outputs of the comparators individually to the microprocessor 2 as shown in FIG. 2. Since the measuring circuit 4 is usually implemented together with the triggering circuit 1 on a single integrated circuit, the advantage results that only one single input pin is needed for the microprocessor 2.

Figure 3:
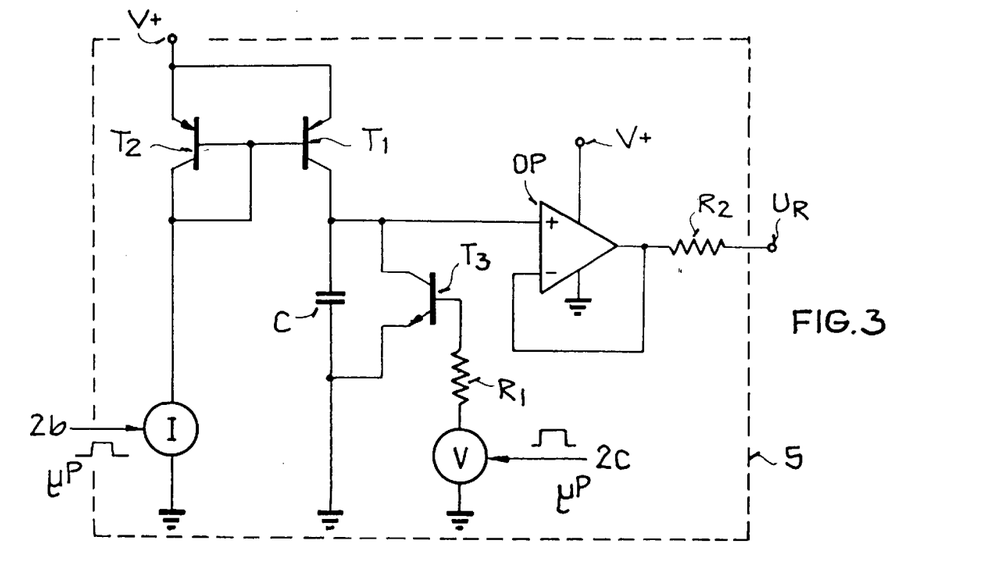
FIG. 3 is a circuit diagram of a ramp generator.
Figure 4:
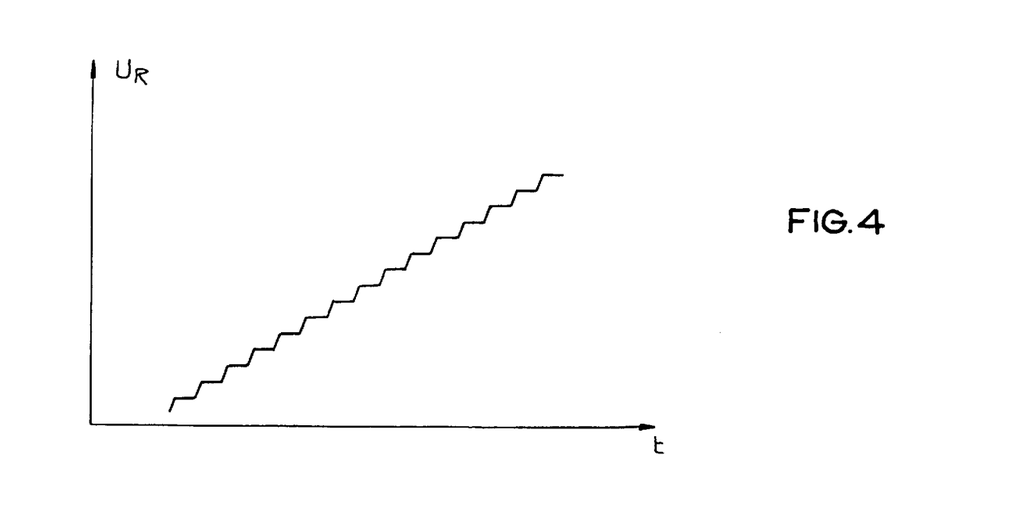
FIG. 4 is a voltage/time graph for a ramp voltage generated by a ramp generator in accordance with FIG. 3.

A ramp generator 5 used in the embodiment examples according to FIGS. 1 and 2 is shown in FIG. 3 in which a capacitor C is charged step by step by a current balancing circuit made up of two transistors T1 and T2 and a controllable current source I. The controllable current source I is driven pulse by pulse through the line 2b of the microprocessor 2 such that the charging voltage at the capacitor C increases in steps. Thus, for example, the ramp voltage $U_R$ is generated with the 15 pulses supplied to the controllable current source I as shown in FIG. 4.

In order to reset the ramp generator 5, the capacitor C is bridged with the emitter-collector junctions of a transistor T3. The base of this transistor T3 is connected to the reference potential of the circuit through a resistor R1 and a controllable voltage source V connected in series. If this controllable voltage source V is switched on through the line 2c of microprocessor 2, the capacitor C discharges through the switched transistor T3. The charging voltage of the capacitor C is taken via an operational amplifier OP connected as a voltage follower, the capacitor voltage being buffered by a resistor R2, to the output of the ramp generator at which the ramp voltage $U_R$ is provided.

Furthermore, the microprocessor 2 performs calibration of the unit of measurement in that the reference voltage $U_{ref}$ generated by the reference voltage source 6 is also compared with the ramp voltage $U_R$ generated by the ramp generator 5 and in the comparotor K4 the number of voltage steps required for this is evaluated by the microprocessor 2 when there is a change in the output voltage level of the comparator K4. This results in an unambiguous association being established between the value of the reference voltage $U_{ref}$ and the necessary number of voltage steps. All measuring errors arising in such a calibration are thus recorded and in particular no temperature compensation is needed.

By including the reference voltage $U_{ref}$ in the calibration process, not only are errors eliminated due to temperature changes but also tolerances in the capacitance of the capacitor C of the ramp generator 5, deviations in the charging current of this capacitor C from the desired value, and similar errors. The accuracy of a measurement depends solely on the pulse duration of the pulse signal supplied to the current source I; it is however easily possible to obtain such pulses from an existing quartz time base and therefore a high degree of measuring accuracy is possible. Deviations in the charging current of the capacitor C and in its capacitance value thus lead simply to a different resolution but not to a higher error.

A realistic resolution could be in the region of 100 to 200 pulses, or in other words between 100 and 200 voltage steps per volt. Since most microprocessors have registers with a 16-bit word width, it is in principle also possible to build counters with a 16 bit resolution. Measured values could therefore be recorded with a very high resolution.

For example, a resolution of 100 pulses/volt can be achieved, corresponding to a resolution of 10 mV with a capacitor C of 10 nF, a charging current of 2 $\mu$A, a pulse frequency of 10 kHz and a pulse to pause ratio of 1:1.

Figure 5:
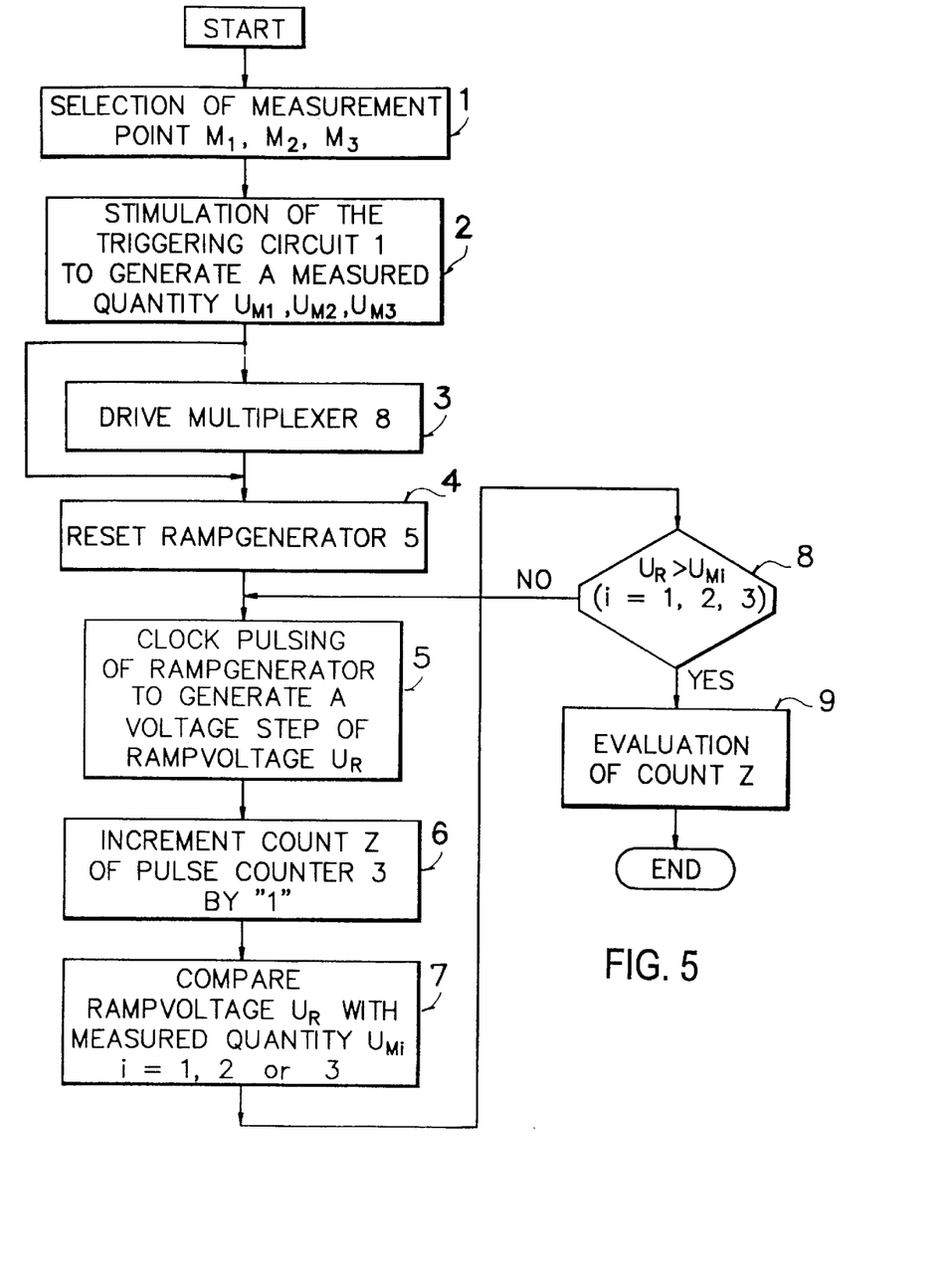
FIG. 5 is a flowchart for performing a measurement cycle in accordance with the invention.

With reference to the flowchart shown in FIG. 5, a measurement operation to be performed by the microprocessor 2 according to FIG. 1 and FIG. 2 will now be described in order to illustrate the method. After the program has started, a measurement point is first selected in the triggering circuit 1 (step 1) via the microprocessor 2. Then, in step 2, the triggering circuit 1 is stimulated in such a way that a measured quantity $U_{M1}$, $U_{M2}$ or $U_{M3}$ is generated at the selected measurement point M1, M2 or M3.

If provision has been made for a multiplexer 8 (see FIG. 2), this is driven in step 3 is such a way that the output signal from the relevant comparator K1, K2 or K3 is supplied to the microprocessor.

Otherwise, the microprocessor 2 performs step 4, causing the ramp generator 5 to be reset through line 2c. This ramp generator 5 is then clocked with a single pulse so that the first voltage stage of the ramp voltage $U_R$ is generated. At the same time, this pulse is also supplied to the counter 3 so that its count Z is incremented by "1".

In the next step 7, the ramp voltage $U_R$ is compared with the measured quantity $U_{Mi}$ at the relevant comparator Ki. Consequently, if the ramp voltage $U_R$ of the measured quantity $U_{Mi}$ is exceeded (see step 8) the count Z of the pulse counter 3 is evaluated in the next step 9. This evaluation is performed by the microprocessor 2 and causes the measured value to be established.

If the ramp voltage $U_R$ has not yet reached the measured quantity $U_{Mi}$ in step 8, however, a return jump takes place to step 5.

Instead of selecting a single measurement point (see step 1) it is also possible to select several measurement points at once which then also generate corresponding measured quantities simultaneously as a result of stimulating the triggering circuit 1.

Figure 6:
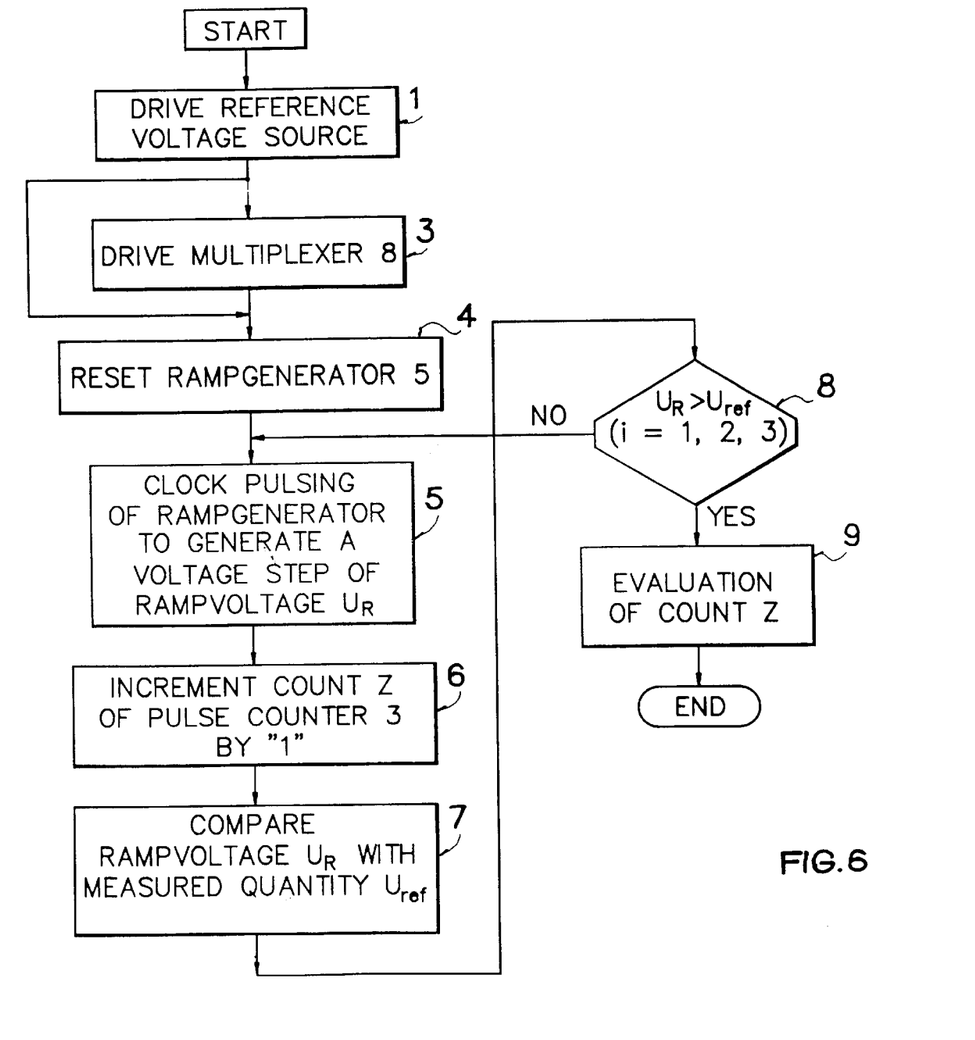
FIG. 6 is a flowchart for performing a calibration of the unit of measurement in accordance with the invention.

The calibration function utilizing the reference voltage source 6 and the associated comparator K4 corresponds to the flowchart shown in FIG. 6. This flowchart corresponds largely with that shown in FIG. 5 except that steps 1 and 2 in FIG. 5 are replaced by the operation "Drive reference voltage source 6". In addition, the ramp voltage $U_R$ is compared with the reference voltage $U_{ref}$ in step 7. Evaluation of the count Z in step 9 leads to the establishment of the calibration factors.

Figure 7:
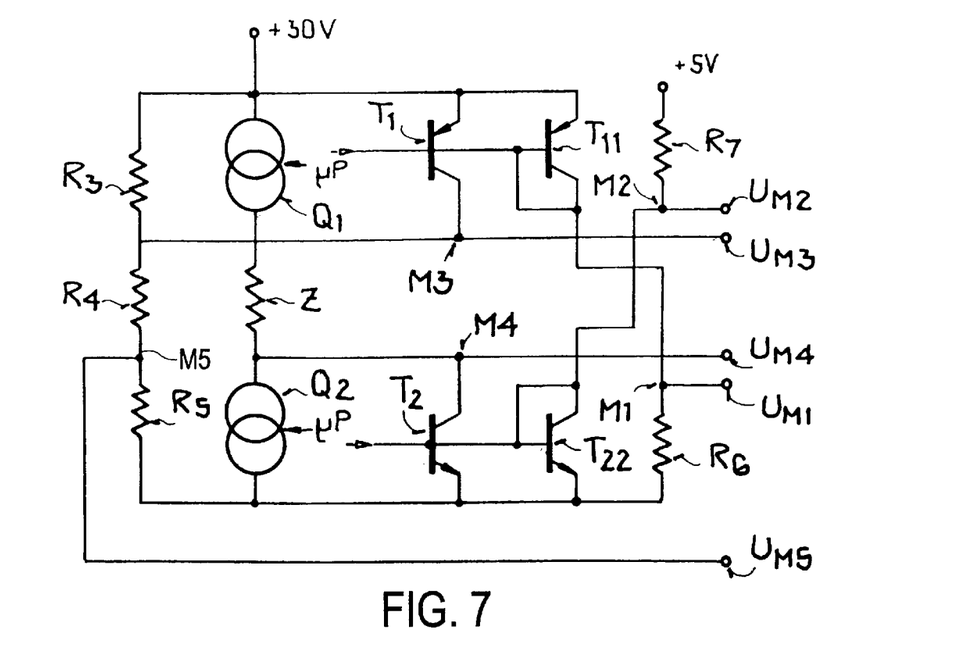
FIG. 7 is a circuit diagram of a trigger circuit with an output stage for triggering a passenger protection system with associated measurement points.

The triggering circuit shown in FIG. 7 as an example, includes a triggering device Z, for instance an ignition pill for triggering an airbag or a belt tightener. Together with a power transistor T1 as high-side switch and a further power transistor T2 as low-side switch, this ignition pill Z makes up the triggering circuit. When triggering occurs, the two power transistors T1 and T2 are driven by the microprocessor 2 (see FIGS. 1 and 2) in such a way that a triggering current flowing through the ignition device Z causes triggering to take place. For the sake of simplicity, this triggering circuit includes only one output stage with associated ignition device Z as compared with the triggering circuit 1 shown in FIG. 1 or 2 where four output stages are provided.

In order to perform the diagnostic functions required in the output stage, this triggering circuit includes several measurement points M1 to M5 which call for additional elements.

Thus, a transistor T11 is provided connected as a diode which together with the power transistor T1 forms a current balancing circuit T1/T11. The output of this current balancing circuit, the collector terminal of transistor T11, forms a first measurement point M1 which is connected through a resistor R6 to the reference potential of the circuit.

Similarly, another transistor T22, also connected as a diode, forms together with the power transistor T2 another current balancing circuit T2/T22 the output of which, the collector electrode of transistor T22, forms a second measurement point M2 that is connected through a suitable resistor R7 to +5 V.

Furthermore, in parallel to both the power transistor T1 and to the power transistor T2 a 20 mA current source Q1 and Q2 respectively is connected that can be controlled by the microprocessor. The junction points to the ignition device Z provide the third and fourth measurement points M3 and M4 respectively.

Finally, a resistor R3 is connected in parallel to the current source Q1 and a voltage divider R4/R5 comprising two resistors R4 and R5 is connected in parallel to the current source Q2. The fifth measurement point M5 is obtained at this voltage divider.

These measurement points M1 to M5 supply measurement signals $U_{M1}$ to $U_{M5}$ when the power transistors T1 and T2 or the current sources Q1 and Q2 are driven accordingly.

The following tests are performed.

In order to test the power transistor T1, the current source Q2 and this power transistor T1 are switched on by the microprocessor $\mu$P. This causes a current of 20 mA to flow both through the ignition device Z and through the power transistor T1, but naturally this current cannot trigger the ignition device Z. The measurement point M3 thus supplies the saturation voltage $UM_3$ of the power transistor T1 and the current of 20 mA flowing through this transistor can be measured indirectly as voltage drop $U_{M1}$ across the resistor R6.

The power transistor T2 is tested in the same way in that this transistor and also the current source Q1 are switched on by the microprocessor $\mu$P in order to be able to measure the saturation voltage $U_{M4}$ of this power transistor T2 at the fourth measurement point M4 and the current flowing through this transistor T2 via the voltage drop $U_{M2}$ across the resistor R7.

With the measurement point M5, the potential midpoint of the power supply (30 V) of the triggering circuit can be tested by forcing both the current sources Q1 and Q2 and also the power transistors T1 and T2 into the blocking state. With the voltage divider, designed to be of high resistance, made up of the resistors R3 and R4 and R5, respectively, the potential level of the ignition device Z is established at approx. 3 V. This is intended to permit a short-circuit to frame that could possibly occur in the cable connection from the triggering circuit to the ignition device Z to be detected with the measured quantity $U_{M5}$.

Thus both the current and the saturation voltage are measured at the power transistors T1 and T2, the saturation voltages being at a level of 1.4 V when using bipolar transistors of triple Darlington design. However, the current flowing through these power transistors is measured as a voltage drop across a resistor R6 and R7, respectively. The values of these resistors are selected such that a voltage drop in the region of 1 V is generated. With a resolution of 10 mV, the two measured quantities are then recorded with adequate precision.

Figure 8:
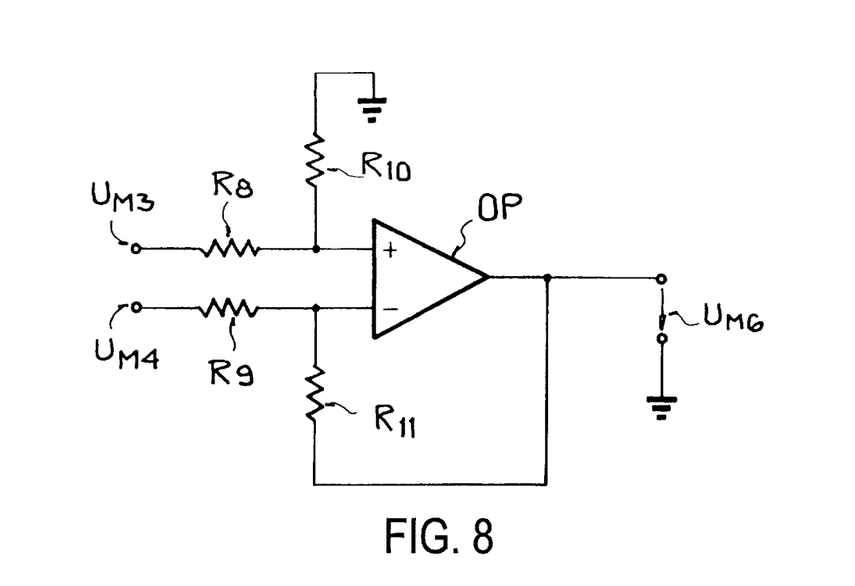
FIG. 8 is a measurement circuit for measuring the resistance of a triggering device required to trigger a safety system, in particular an ignition pill.

In order to measure the resistance of the ignition device Z, the two measured quantities $U_{M3}$ and $U_{M4}$, whose voltage difference represents the voltage drop across this ignition device Z, are supplied to a subtracting circuit as shown in FIG. 8 where this voltage difference is amplified and can subsequently be supplied as measured quantity $U_{M6}$ directly to a measurement input of measuring circuit 4.

This subtracting circuit as shown in FIG. 8 includes an operational amplifier OP whose non-inverting input is connected on the one hand through a resistor R10 to the reference potential of the circuit and on the other hand through a resistor R8 to the measurement point M3. The inverting input, however, is connected through a resistor R9 to the measurement point M4 and also through a resistor R11 to the output at which the amplified voltage drop $U_{M6}$ can be picked off through the ignition device Z.

If the resistors R10 and R11 each have a resistance value amounting to thirty times that of the resistors R8 and R9 which have the same resistance value, then a gain factor of 30 results. With a resistance value of 1.6 to 6.6 Ω and a current of 20 mA, a voltage drop of 32 mV to 132 mV is created across the ignition pill resulting in a measured quantity $U_{M6}$ at the output of the subtracting circuit amounting to between 0.96 V and 3.96 V. These values are situated ideally in the measuring range of the ramp voltage generated by the ramp generator 6, where the resolution of 100 voltage steps per volt corresponds to about 16 mΩ.

Finally, the safety-relevant operating voltages must be checked. For this purpose, for example, the power supply voltage of +5 V is divided down with a voltage divider made up of equally sized resistors to 2.5 V and is thus within the voltage range of the ramp generator. Similarly, using a suitably dimensioned voltage divider, even higher operating voltages or the charging voltages of autonomous capacitors can be measured.

In order to safeguard the power supply to the triggering electronics in the event of an accident, when a fault can arise in the onboard network of the motor vehicle, so-called autonomous capacitors are provided that contain sufficient energy in order to definitely trigger the ignition devices, for example the ignition pills. Since aging of the autonomous capacitors and thus a reduction of their capacitance cannot be excluded, their charging capacity must be checked constantly, and as a rule this check is only performed at the time of starting the motor.

The 20 mA current sources Q1 and Q2 described in FIG. 7 are used for this purpose in order to bring a pulse-shaped charge to these autonomous capacitors. The change in charging voltage brought about by this pulse-shaped charge serves as a measured quantity and is also supplied to the measuring circuit 4.

If a capacitor with 4700 $\mu$F is charged with a current of 20 mA, its charging voltage varies at a rate of 4.25 V per second. A measurement duration of 0.5 s is therefore sufficient to be able to determine its capacitance with sufficient accuracy.

The application of this method in accordance with the invention is not only restricted to analog circuits in conjunction with passenger protection systems for motor vehicles, but it can also be applied in other fields such as, for example, circuits for motor control systems.

What is claimed is:

1. A method for acquiring measured values in electronic, analog circuits having at least one measurement point, in particular safety-critical electronic circuits for passenger protection services in motor vehicles, comprising the steps of: detecting electrical potentials generated at the measurement points as measured quantities ($U_{M1}$, $U_{M2}$, $U_{M3}$); generating a ramp voltage ($U_R$) which increases in steps and independently of any measured quantity; comparing the respective measured quantities detected at the measurement points (M1, M2, M3) with the ramp voltage ($U_R$); determining the number of voltage steps of the ramp voltage required until the voltage value of the measured quantity ($U_{M1}U_{M2}$, $U_{M3}$) is reached at the respective measurement point (M1, M2, M3) as a unit of measurement; and calibrating the unit of measurement by comparing the ramp voltage ($U_R$) to a reference voltage ($U_{ref}$).

2. A method in accordance with claim 1, wherein the measured value acquisition further includes:
   a) stimulating the circuit in order to generate one or several of the measured quantities ($U_{M1}$, $U_{M2}$, $U_{M3}$) at one or several selected measurement points (M1, M2, M3);
   b) generating a first voltage step of the ramp voltage ($U_R$);
   c) comparing the first voltage step of the ramp voltage ($U_R$) with the measured quantity/quantities ($U_{M1}$, $U_{M2}$, $U_{M3}$);
   d) increasing the ramp voltage ($U_R$) by a further voltage step if the ramp voltage ($U_R$) is less than the measured quantity/quantities ($U_{M1}$, $U_{M2}$, $U_{M3}$) and establishing the number of voltage steps and again executing step c);
   e) ending a measuring cycle and evaluation of the number of voltage steps if the ramp voltage ($U_R$) is greater than the measured quantity/quantities ($U_{M1}$, $U_{M2}$, $U_{M3}$).

3. A method in accordance with claim 2, wherein the step of calibrating the unit of measurement includes the following steps:
   a) generating the reference voltage ($U_{ref}$);
   b) generating the ramp voltage ($U_R$) with a single voltage step;
   c) comparing the voltage step of the ramp voltage ($U_R$) with the reference voltage ($U_{ref}$);
   d) incrementing of the ramp voltage ($U_R$) by a further voltage step if the ramp voltage ($U_R$) is less than the reference voltage ($U_{ref}$) and determines the number of voltage steps and again executing step c);
   e) evaluating the number of voltage steps if the ramp voltage ($U_R$) is greater than the reference voltage ($U_{ref}$).

4. Method in accordance with claim 3, wherein the evaluation of the number of voltage steps is effected by software using a microprocessor.

5. Circuit arrangement of performing the method in accordance with claim 4, including: a clock-pulsed ramp generator to generate the ramp voltage ($U_R$); a reference voltage source to generate the reference voltage ($U_{ref}$); and individual comparators for comparing the ramp voltage ($U_R$) with each of the measured quantities ($U_{M1}$, $U_{M2}$, $U_{M3}$) and with the ramp voltage ($U_R$) the reference voltage ($U_{ref}$).

6. Circuit arrangement in accordance with claim 5, further including a pulse counter connected to the ramp generator to determine the number of voltage steps.

* * * * *